United States Patent [19]

Germer et al.

[11] Patent Number: 4,754,217

[45] Date of Patent: Jun. 28, 1988

[54] SEASONAL RESET FOR ELECTRIC WATTHOUR METER REGISTERS

[75] Inventors: Warren R. Germer; Leslie J. Rosenau, both of Dover; Albert R. Varney, Jr., Rochester, all of N.H.

[73] Assignee: General Electric Company, Somersworth, N.H.

[21] Appl. No.: 22,146

[22] Filed: Mar. 5, 1987

[51] Int. Cl.⁴ .................. G01R 11/57; G01R 11/64
[52] U.S. Cl. ........................... 324/116; 324/103 R; 324/142; 364/483
[58] Field of Search ............ 324/116, 103 R, 142; 340/637, 870.02; 364/483, 492

[56] References Cited

U.S. PATENT DOCUMENTS

| | | | |
|---|---|---|---|
| 4,050,020 | 9/1977 | Germer et al. | 324/116 X |
| 4,106,095 | 8/1978 | Yarbrough | 364/483 X |
| 4,229,795 | 10/1980 | Vieweg et al. | 324/103 R X |
| 4,283,772 | 8/1981 | Johnston | 324/103 R X |

Primary Examiner—Reinhard J. Eisenzopf
Assistant Examiner—Vinh P. Nguyen
Attorney, Agent, or Firm—Robert E. Brunson; Thomas R. Morrison

[57] ABSTRACT

An electric watthour meter includes apparatus for delaying a seasonal rate change until data accumulated in the meter is read out. Dates in a rate-change library, consisting of dates on which a rate change is authorized, are compared each day with the current date. When a match between a rate-change date and the current date is found, an arming signal is generated. The arming signal remains ineffective until a reset signal is generated at the completion of meter reading. Following the reset signal, the arming signal is reset.

6 Claims, 2 Drawing Sheets

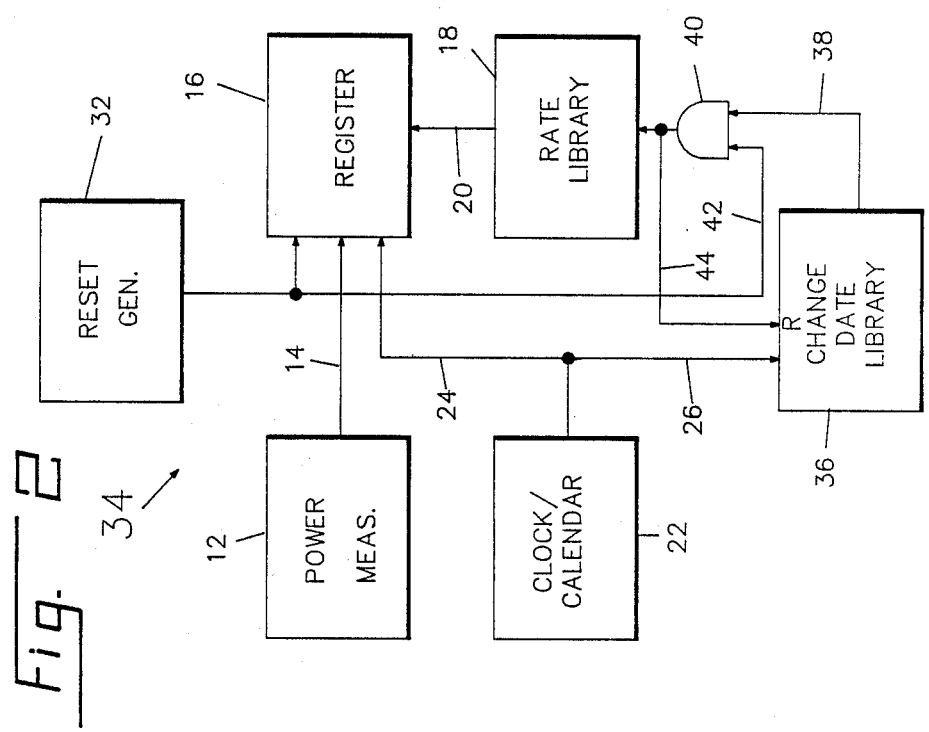

SEASONAL RESET FOR ELECTRIC WATTHOUR METER REGISTERS

BACKGROUND OF THE INVENTION

The present invention relates to watthour meter registers and, more particularly, to apparatus for changing a rate per unit consumption based on seasonal or other criteria.

Utilities generally consider that the cost of electric energy can be attributed to two factors: (1) the out-of-pocket cost for generating the energy (fuel, operating and maintenance personnel and equipment, etc.) and (2) the capital cost of the generating equipment must be installed to generate the electric energy.

Electric energy consumption is far from constant over a day, month or year. In some seasons such as, for example, the air-conditioning season, power demand is much greater than at other seasons. In order to provide adequate service, the utility must provide generating equipment capable of satisfying the maximum demand which it may experience. Thus, the utility must bear the capital cost of installing sufficient generating capacity to satisfy the peak demand. It must do this while knowing that, except at peak times, a substantial portion of its generating capacity remains idle. According to this analysis, the capital component of the total energy cost is governed by the peak demand in the peak season.

Some rate-setting bodies have recognized the importance of peak demand and have established tariffs in a manner designed to encourage energy consumers to limit peaks in their energy usage and to shift energy consumption from peak to off-peak times. One of such tariffs permits the utility to measure the amount of energy consumed in a sequence of demand intervals. At the end of each demand interval, the demand in the just-completed demand interval is compared with a stored value representing the highest demand in any demand interval since the register was last reset. If the demand in the just-completed demand interval is higher than the previous high demand value, then the value of the demand in the just-completed demand interval is stored and the previously-stored value is deleted. The value of the maximum demand existing at the time the meter is read determines the rate the consumer must pay for all of its electric energy. Thus, the consumer receives a powerful economic incentive to limit the peak load placed on the utility system.

In most utility systems, the demand register is reset by a meter reader or by automatic remote reading equipment when the readings on the register are collected for billing purposes. In some systems, not of concern to the present invention, more than one high demand value is stored. For example, the five highest values during the demand interval may remain available for internal or external purposes.

A further economic device for limiting maximum demand accounts for the reality of peak consumption seasons. Rate-setting bodies permit utilities to charge higher rates during some seasons (air-conditioning season is one example) than during others. This technique is known as time-of-use metering.

A problem arises in selecting the manner, or time, for changing from one rate to another in time-of-use metering. One technique for selecting a time to change rates includes automatic change from one rate to the other at the beginning (midnight) of the first day of each rate season. An internal clock/calendar maintains an updated file containing the present time and date. The dates on which seasonal change is to occur is stored in a change-date library. At midnight each day, the present date is compared with the dates on which seasonal change is required. When a match is found, a rate change is performed. If such automatic rate change is made in a register which includes a demand register, when the register is read at a later time, there may be no indication of rate prevailing at the time the maximum demand was recorded. Thus, either the consumer may be unfairly penalized, or the utility may lose revenue to which it is entitled.

OBJECTS AND SUMMARY OF THE INVENTION

Accordingly, it is an object of the invention to provide a watthour register which overcomes the drawbacks of the prior art.

It is a further object of the invention to provide a watthour register wherein a seasonal rate change is delayed until the meter is read.

It is a further object of the invention to provide a watthour register wherein a date-change library produces an arming signal partially enabling a rate change. Full enablement of the rate change requires a reset signal generated at the conclusion of meter reading. The reset signal may be the same signal used for resetting a demand register.

Briefly stated the present invention provides apparatus for delaying a seasonal rate change in an electric watthour meter until data accumulated in the meter is read out. Dates in a rate-change library, consisting of dates on which a rate change is authorized, are compared each day with the current date. When a match between a rate-change date and the current date is found, an arming signal is generated. The arming signal remains ineffective until a reset signal is generated at the completion of meter reading. Following the reset signal, the arming signal is reset.

According to an embodiment of the invention, there is provided an electric watthour metering system of a type responsive to at least first and second seasonal billing rates comprising: means for measuring a power consumption, means for accumulating the power consumption to measure an energy consumption, a clock/calendar effective for producing a date signal and a time signal, change means responsive at least to the date signal for performing a change between the first and second seasonal billing rates, means for producing a reset signal effective for resetting at least one element in the electric watthour metering system, and means for delaying an effect of the change means until the reset signal is produced.

According to a feature of the invention, there is provided a method for watthour metering responsive to at least first and second seasonal billing rates, comprising: measuring a power consumption, accumulating the power consumption to measure an energy consumption, producing a date signal and a time signal, changing between the first and second seasonal billing rates in response to at least the date signal, producing a reset signal effective for resetting at least one element in the electric watthour metering system, and delaying the changing until the reset signal is produced.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 2 is a block diagram of a watthour meter having a time-of-use register according to an embodiment of the invention.

DETAILED DESCRIPTION OF THE PREFERRED EMBODIMENT

Figure 1:
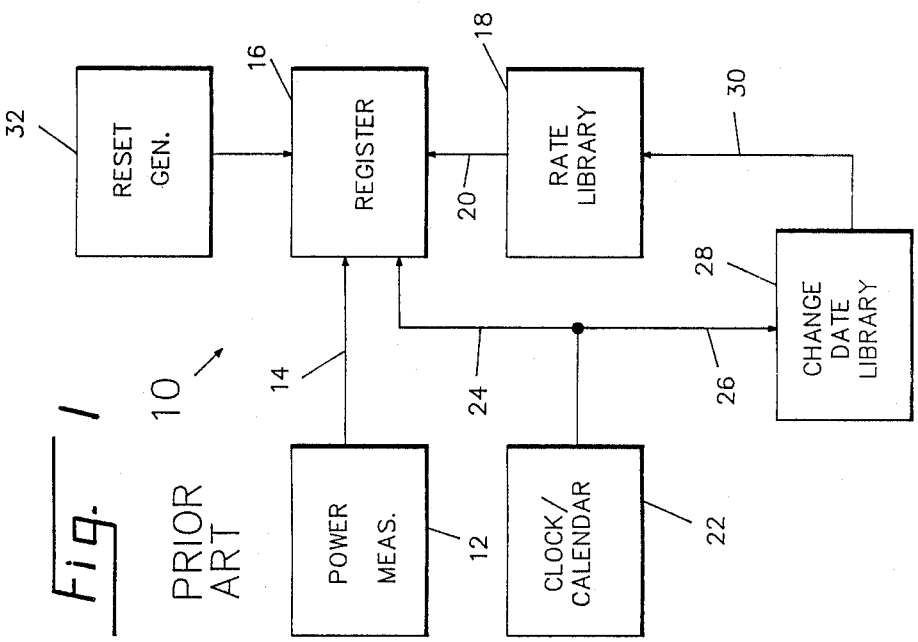
FIG. 1 is a block diagram of a watthour meter having a time-of-use register according to the prior art.

Referring first to FIG. 1, there is shown, generally at 10, a watthour meter according to the prior art. A power-consumption metering device 12, of any convenient type, produces an output for application on a line 14 to a register 16. A rate library 18 contains data on rates for all seasons. An output from rate library 18, applied on a line 20 controls the seasonal parameters in register 16. Such seasonal parameters may be, for example, a length of a demand interval and the times of day during which certain rates apply. A clock/calendar 22 produces a time signal for application on a line 24 to register 16. Register 16 employs the time signal for setting the lengths of demand intervals, and optionally selecting times during which demand registering is enabled and disabled. In addition, the time signal may be employed in register 16 for switching between two or more registers for separate accumulation of energy consumption at peak and off-peak hours.

Clock/calendar 22 also provides a date and time signal on a line 26 to a change-date library 28. Change-date library 28 contains a library of all dates on which a rate change is enabled. At a specific time each day such as, for example, at midnight, the calendar signal from clock/calendar 22 is compared with all rate-change dates in change-date library 28. If a match between the current date and one of the rate-change dates is found, change-date library 28 applies a rate-change enable signal on a line 30 to rate library 18. Thereupon, rate library 18 applies signals representing the new rates on line 20 to register 16. A reset generator 32 is provided, especially in systems having demand registers, for resetting register 16 after the accumulated data is read by a meter reader or by remote signals. Resetting zeroes the readings in the demand register in preparation for the ensuing period. In manually-reset systems, reset generator 32 may be, for example, a manually-actuated switch.

Power-consumption metering device 12 and register 16 may be of any convenient type. For example, power-consumption metering device 12 may be an electro-mechanical metering device wherein a metal disk (not shown) is rotated at a speed proportional to power consumption by the energy user. In some such conventional devices, power-consumption metering device 12 generates output pulses each signifying the consumption of a predetermined quantum of electric energy. Power-consumption metering device 12 may equally be a solid-state metering device of the prior art, or of a type to be later developed. Similarly, register 16 may be a mechanical, electro-mechanical or fully electronic device. In one embodiment, the functions of register 16, rate library 18, clock/calendar 22 and change-date library 28 are electronic and are achieved using a conventional microprocessor with suitable peripheral memory and other supporting circuits.

The prior-art system described in the foregoing has the drawback that demand data existing before the rate change is not differentiated from demand data following the rate change. Thus, when register 16 is read at some later time, there is no way to discover when the recorded maximum demand occurred. To overcome this drawback, some prior systems automatically store a snapshot of all energy consumption and demand data just prior to the rate change, then perform an automatic demand reset and finally begin the new rate. Demand data from before the rate change is thus differentiated from demand data following the rate change, but this requires that two sets of data be used to calculate the consumer's bill.

Since it is customary for meters to be read on a monthly cycle, with a particular meter being read on or about the same day of each month, the month in which a rate change occurs is a transition month. A transition month has data from two different rates which must be used to calculate a bill, since it is impossible to read all meters coincident with the automatic rate change. To avoid the different data processing requirements of transition months and the resulting confusion of consumers, it is highly desirable to synchronize the rate change to the reading and reset actions. Then each bill covers only one rate and the data processing requirements for all consumers is the same for all months of the year.

Referring now to FIG. 2, A watthour meter according to an embodiment of the invention, shown generally at 34, includes power-consumption metering device 12, register 16, rate library 18, clock/calendar 22 and reset generator 32 performing functions corresponding to the apparatus of the prior art described in the preceding. As in the prior art device, a change-date library 36 checks each day for correspondence between the current date and a change-rate day. In contrast with the prior art, when a match is discovered, change-date library 36 applies an arming signal on a line 38 to one input of an AND gate 40. The other input of AND gate 40 is connected by a line 42 to receive the reset signal from reset generator 32. The output of AND gate 40 is applied to rate library 18 and connected back on a line 44 to a reset input R of change-date library 36.

In operation, when a change-date correspondence is encountered in change-date library 36, the arming signal on line 38 is generated and remains available until change-date library 36 is reset by a signal at its reset input R. Such a signal is only generated when AND gate 40 receives a reset signal from reset generator 32. Thus, rate change is delayed until the accumulated data in register 16 is read by the utility. When the reset signal for resetting register 16 is produced, such reset signal also enables the second input of AND gate 40. This enables the change of rate in rate library 18, whereby the new seasonal rate becomes effective.

The signal from AND gate 40 enabling the rate change, fed back on line 44 to the reset input R of change date library 36, resets change-date library 36, thereby removing the arming signal from line 38. If a reset signal is generated by reset generator 32 at a time when no rate change is enabled, the absence of the arming signal on line 38 maintains AND gate 40 inhibited and prevents an erroneous rate change.

As in the prior-art device, the functions disclosed in FIG. 2 may be realized using any convenient types of devices including mechanical, electro-mechanical and electronic. The functions of register 16, rate library 18, clock/calendar 22 and change-date library 28 may be embodied in a microprocessor with suitable conventional supporting circuits.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What we claim is:

1. An electric watthour metering system of a type responsive to at least first and second seasonal billing rates comprising:
    means for measuring a power consumption; means responsive to chance means for accumulating said power consumption to measure an energy consumption during at least first and second billing rate periods;
    a clock/calendar effective for producing a date signal and a time signal;
    said change means responsive at least to said date signal for performing a change between said first and second seasonal billing rates;
    means for producing a reset signal effective for resetting at least one element in said electric watthour metering system; and
    means for delaying an effect of said change means until said reset signal is produced.

2. An electric watthour meter according to claim 1 wherein said change means includes:
    a change-date library;
    said change-date library containing rate-change dates on which rate-changes are permitted;
    means for comparing said date signal with each of said rate-change dates and for generating an arming signal in response thereto.

3. An electric watthour meter according to claim 2 wherein:
    said means for delaying an effect includes an AND gate;
    said arming signal being connected to one input of said AND gate and said reset signal being applied to a second input of said AND gate; and
    means responsive to an output of said AND gate for performing said change.

4. An electric watthour meter according to claim 3, further comprising means for resetting said arming signal in response to said output of said AND gate.

5. An electric watthour meter according to claim 1 wherein said means for producing a reset signal includes a manually actuated switch.

6. A method for watthour metering responsive to at least first and second seasonal billing rates, comprising:
    measuring a power consumption;
    accumulating said power consumption to measure an energy consumption in response to change in at least said first and second billing rates;
    producing a date signal and a time signal;
    changing between said first and second seasonal billing rates in response to at least said date signal;
    producing a reset signal effective for resetting at least one element in said electric watthour metering system; and
    delaying said changing until said reset signal is produced.

* * * * *